United States Patent [19]

Lewandowski

[11] Patent Number: 5,155,692

[45] Date of Patent: Oct. 13, 1992

[54] TECHNIQUE FOR ROUTING CONDUCTIVE PATHS

[75] Inventor: James L. Lewandowski, Plainsboro, N.J.

[73] Assignee: AT&T Bell Laboratories, Murray Hill, N.J.

[21] Appl. No.: 396,259

[22] Filed: Aug. 21, 1989

[51] Int. Cl.[5] ............................................. G06F 15/20
[52] U.S. Cl. ................................... 364/489; 364/488; 364/578
[58] Field of Search ............... 364/488, 489, 490, 491, 364/578

[56] References Cited

U.S. PATENT DOCUMENTS

| | | | |
|---|---|---|---|
| 4,642,890 | 2/1987 | Hechtman et al. | 364/489 |
| 4,713,773 | 12/1987 | Cooper et al. | 364/488 |
| 4,724,383 | 2/1988 | Hart | 364/488 |
| 4,852,016 | 7/1989 | McGehee | 364/491 |
| 5,032,991 | 7/1991 | Davidson et al. | 364/490 |

OTHER PUBLICATIONS

C. L. Liu, *Combinatorial Mathematics* (McGraw-Hill, 1968), pp. 259–279.

*Primary Examiner*—Vincent N. Trans
*Attorney, Agent, or Firm*—Robert B. Levy

[57] ABSTRACT

A technique is provided for routing paths (22) between selected pairs of test points (18) and probe points (20) on the exposed major surface of a fixture (10). The first step in the technique is to simulate a set of non-intersecting spokes (28) which link each test point to at least one arbitrary probe point (20). Next, a set of tracks (32) is superimposed on the spokes (28) such that each track is everywhere generally orthogonal to each spoke, thereby creating a grid in which the spokes and tracks intersect each other. A path (22) between a selected test point and probe point is then routed along at least a portion of the spokes and tracks in the grid by the use of a network flow technique.

9 Claims, 3 Drawing Sheets

TECHNIQUE FOR ROUTING CONDUCTIVE PATHS

TECHNICAL FIELD

This invention relates to a technique for routing conductive paths between each of two families of points on an object such as a test fixture.

BACKGROUND OF THE INVENTION

Testing is an important step in the process of manufacturing semiconductor devices, especially those which are digital in nature. Typically, such semiconductor devices are often tested by first supplying successive test vectors to the device and then capturing the response signal generated by the device upon receipt of each test vector. By analyzing the response signals, the operation of each semiconductor device can be verified. If faults are discovered, then appropriate steps can be taken to adjust the manufacturing process to eliminate the faults in subsequently made semiconductor devices.

In practice, the test vectors are coupled to, and the response signals are recovered from, each semiconductor device under test through a test fixture designed for this purpose. A typical fixture comprises a substrate having a plurality of centrally located test points arranged the same as the conductive members on the device for making contact therewith when the device is placed on the fixture. Depending on the configuration of the conductive members of the device, the test points may take the form of metal-plated through holes or metallized areas. Near the periphery of the substrate is a plurality of probe points, each connected to a separate channel of a conventional testing machine which serves to supply the test signals to, and recover the response signals from, the device under test.

Each test point is connected to one of the probe points via a conductive path, typically, a metallized strip on the upper surface of the substrate. In the case where the substrate is comprised of multiple layers, each path may take the form of a combination of metallized strips, each strip lying on a separate one of the layers and being connected to a strip on an adjacent layer by a plated through-hole (via). Alternatively, although less desirable, the paths could each take the form of individual wires soldered to the test points and probe points.

In the past, the process of routing, that is, laying out, the paths between the test points and probe points has been done manually, on an ad hoc basis. For fixtures which have a large number of probe points and test points, the process of routing the paths is extremely burdensome, especially if obstacles such as screw holes in the substrate are to be avoided. Since each test fixture is specific for a particular type or code of semiconductor device, when a new semiconductor device must be tested, a new fixture is usually required. In many semiconductor manufacturing facilities, there is a constant need for new test fixtures.

In U.S. Pat. No. 4,642,890, issued on Feb. 17, 1987, to C. D. Hechtman et al., and assigned to AT&T Technologies, there is disclosed a method for routing conductive paths between each of a first and second family of points on a body, such as a test fixture. As described in the Hechtman et al. patent, an electrostatic analog is employed to establish a set of paths which link arbitrary pairs of the two families of points. Unfortunately, the technique described in this patent incurs the disadvantage that paths cannot readily be routed between particular pairs of the two families of points. Thus, a test fixture which requires that a selected pair of points be linked must still be routed manually.

Thus, there is a need for a technique for efficiently routing conductive paths on a test fixture between selected pairs of test points and probe points.

SUMMARY OF THE INVENTION

In accordance with the invention, a technique is provided for routing paths between selected pairs of test points and probe points located on a body, such as a substrate. The method is initiated by first simulating a set of non-intersecting spokes which link each test point to one or more probe points, although not necessarily the desired probe point. Next, a set of tracks is superimposed on the spokes such that each track is everywhere generally orthogonal to each spoke, thereby creating a grid in which the spokes and tracks intersect each other. A path between each selected test point and probe point is then routed along at least a portion of the spokes and tracks in the grid, typically by the use of a network flow techniques.

DETAILED DESCRIPTION

Figure 1:
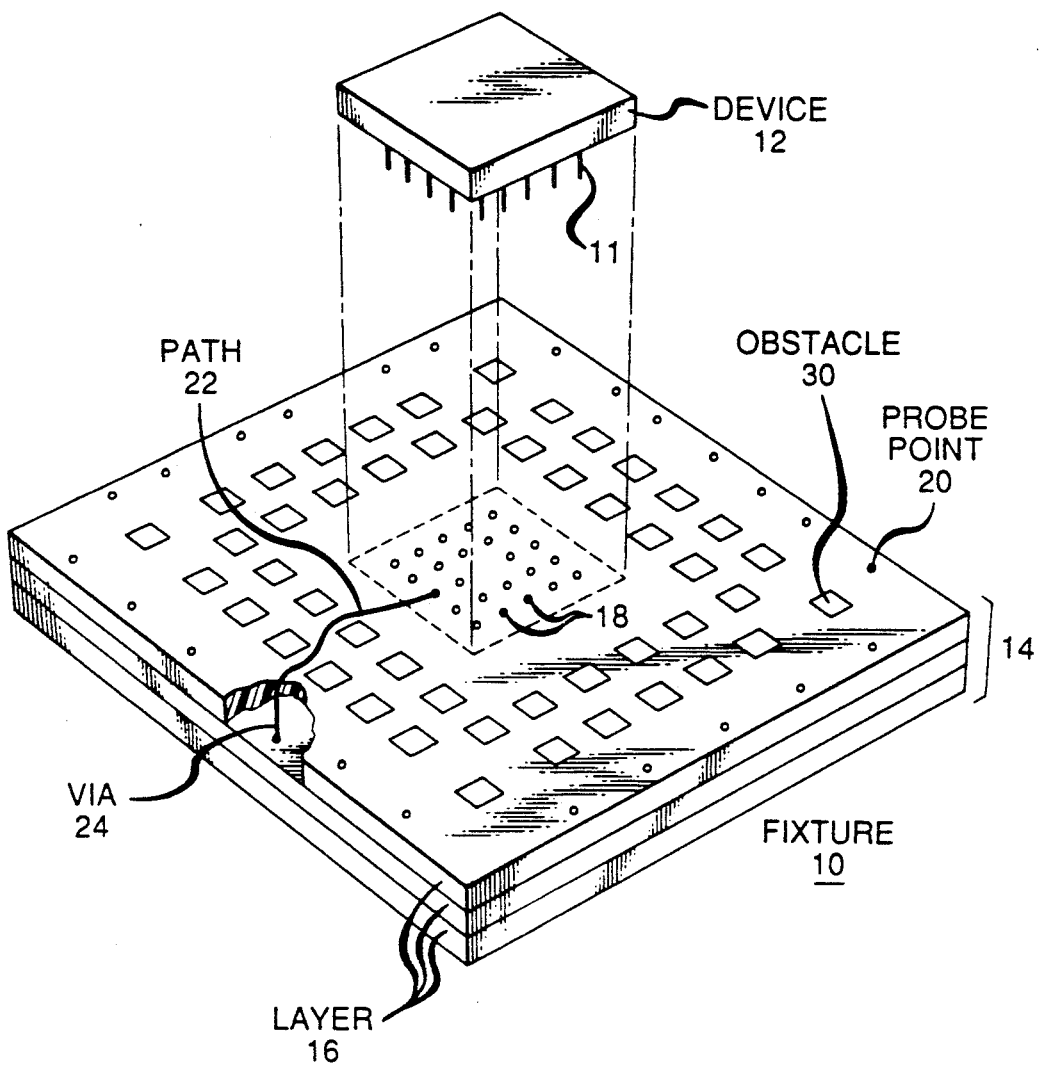
FIG. 1 is a perspective view, partially cut away, of a prior art test fixture which carriers each of a set of test points and probe points on one of its major surfaces.

Referring to FIG. 1, there is shown a perspective view, partially cut away, of a prior art test fixture 10 for coupling each lead 11 of a semiconductor device 12 to a testing machine (not shown). The fixture 10 comprises a substrate 14 formed of one or more layers 16 of an insulative material such epoxy resin or the like. Near the center of the exposed surface of the uppermost layer 16 is a pattern of test points 18 arranged in the same pattern as the leads 11 of the semiconductor device 12 for making contact with the leads when the device is placed on the substrate. Depending on the configuration of the leads 11, the test points 18 may take the form of metal plated through-holes or metallized pads.

Near the periphery of the exposed surface of the upper layer 16 of the substrate 14 is a plurality of probe points 20, which are at least equal in number to the test points 18. The probe points 20 are each connected to a separate channel of a conventional testing machine (not shown) of a type well known in the art. Each test point 18 is electrically coupled to a one of the probe points 20 by a path 22 which typically takes the form of a metallized strip lying wholly on the uppermost layer 16. Alternatively, each path 22 may be comprised of a group of individual strips, each lying on a separate one of the underlying layers 16, and each connected to a strip on an adjacent layer by a metal-plated via (through-hole) 24.

Figure 2:
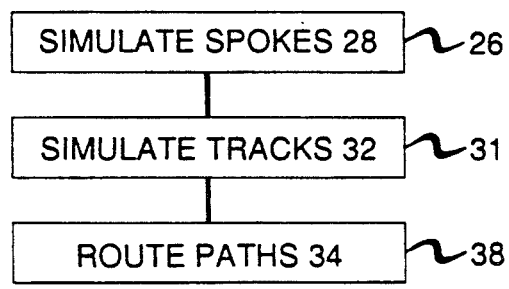
FIG. 2 is a flowchart description of a technique, in accordance with the invention, for routing a path between selected pairs of test points and probe points in FIG. 1.
Figure 3:
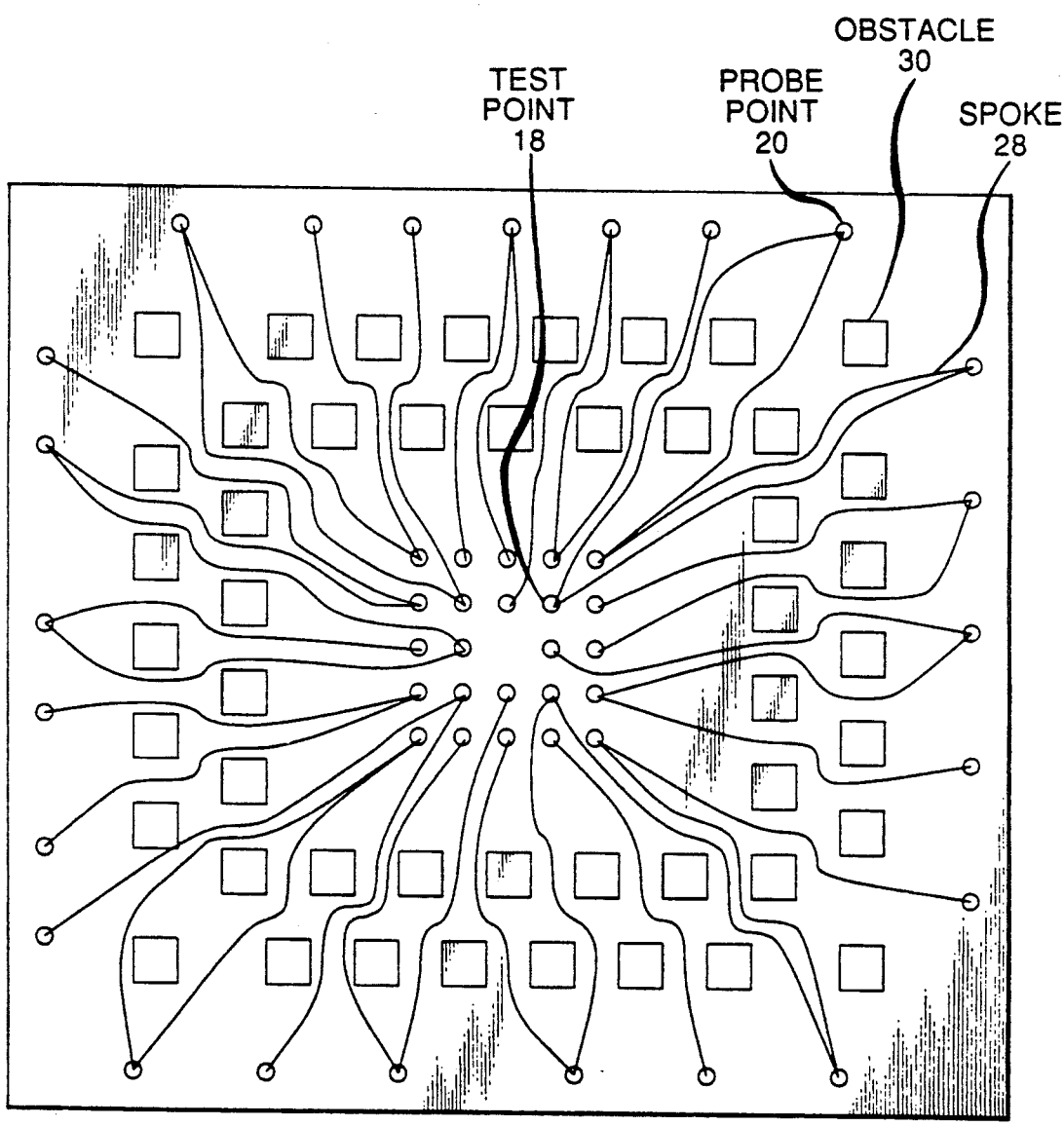
FIG. 3 is a plan view of the fixture of FIG. 1 showing a simulated set of spokes which link a separate one of the test points to one or more arbitrary probe points.

As discussed at the outset, the process of laying out or routing the paths 22 has been done manually in the past, on an ad hoc basis. In accordance with the invention, a technique has been developed for routing the paths 22 between selected pairs of test points 18 and probe points 20 in an efficient and timely manner. Referring to FIG. 2, there is shown a flowchart representation of the process of routing the paths 22 in accordance with the invention. The first step (step 26) in the process is to a simulate a set of non-intersecting spokes 28 on the exposed surface of the uppermost layer 16 which link each test point 18 to at least one probe point 20 as seen in FIG. 3, although not necessarily the desired probe point. Thus, simply generating the spokes 28 does, by itself, provide a solution to the problem of establishing a path 22 between a selected test point 18 and probe point 20.

Referring to FIG. 3, the preferred approach to generating the spokes 28 is to employ the electrostatic analog, as described in great detail in the aforementioned Hechtman et al. patent, incorporated by reference herein. The first step in the process of employing the electrostatic analog to generate the spokes 28 is to attribute an equal but opposite point charge to each of the test points 18 and probe points 20 such that the total sum of the charges is zero. In this way, an electric field is simulated of the uppermost layer 16. The electric potential ($\phi$) within this simulated electric field is then computed by numerical analysis in the manner taught in the Hechtman et al. patent. In computing the potential $\phi$, the edges of the uppermost layer 16, as well any obstacles 30, such as screw holes for example, are taken into account by setting the boundary conditions such that no lines of electric flux pass through the edges of the layer or through the obstacle. In other words, the rate of change of the potential ($d\phi/dn$) everywhere normal to the edges of the uppermost layer 16 and at the perimeter of each of the obstacles 30 is zero.

Once the potential $\phi$ has been determined, then the spokes 28 are established so each coincides with a line of electric flux linking a pair of test points 18 and probe points 20. As described in the aforementioned Hechtman et al. patent, each line of electric flux between a test point 18 and a probe point 20 within the simulated electric field can be determined using a parametric equation. By their very nature, the lines of electric flux, and hence the spokes 28 which coincide therewith, will be non-intersecting. Additionally, by virtue of the boundary conditions established in the manner described above, the electric flux lines, and hence the spokes 28, avoid the obstacles 30. In the case where the obstacles 30 are closely spaced together, it may be necessary to establish that the spokes 28 passing between a pair of narrowly spaced obstacles are not spaced too close to incur a design rule violation. If the spokes 28 passing between a pair of obstacles 30 are too closely spaced, then only one spoke can be used.

Figure 4:
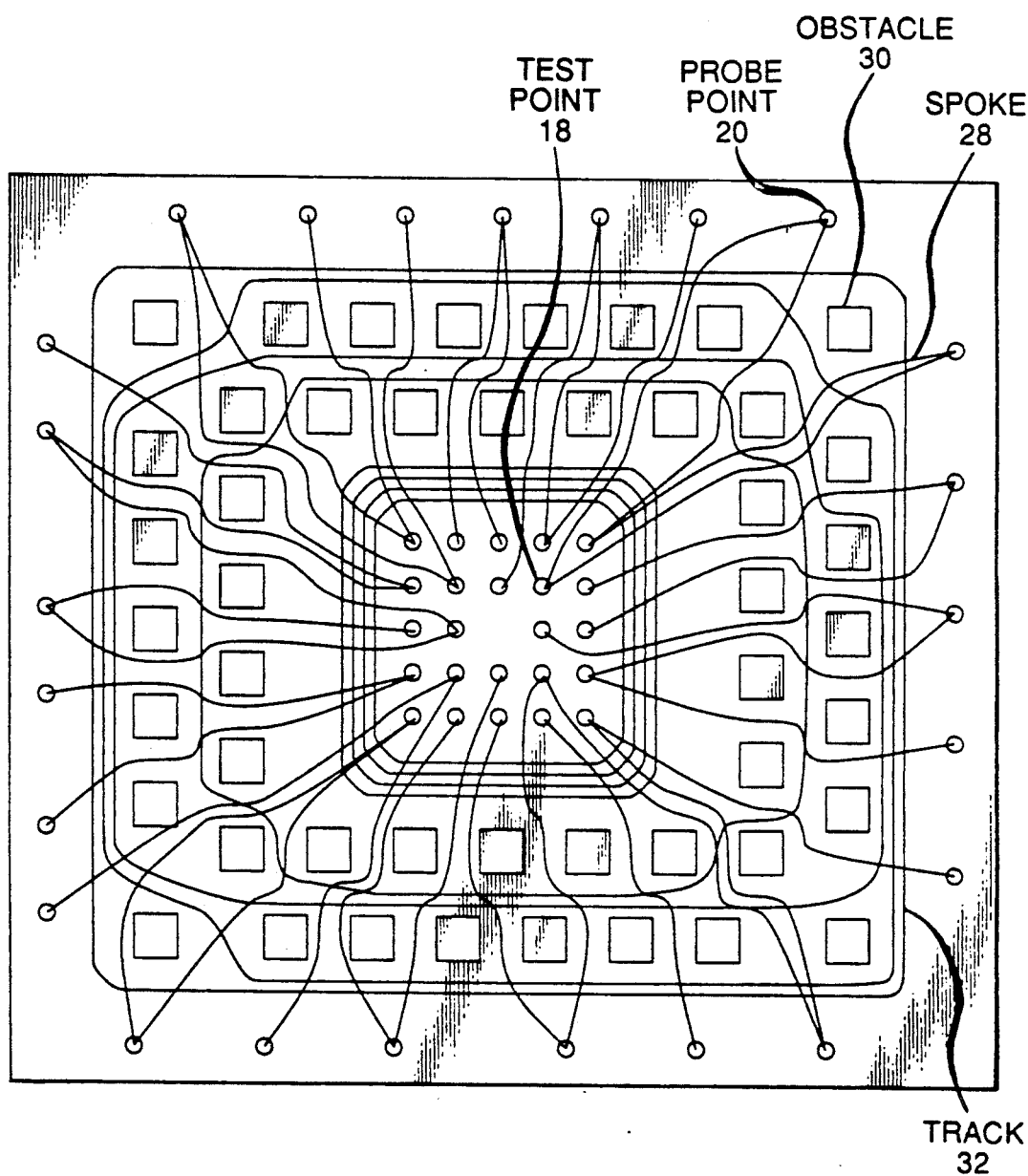
FIG. 4 is a plan view of the fixture of FIG. 1 showing a set of tracks superimposed on the spokes to form a grid of intersecting lines.

Referring to FIG. 2, after the spokes 28 are simulated on the uppermost layer 16, then the next step (step 31) is to superimpose a set of tracks 32 on the layer so that each track is generally orthogonal to each spoke as shown in FIG. 4. Each track 32 in FIG. 4 can be thought of as a line of magnetostatic equipotential, and could be generated directly using a magnetostatic analog. However, the process of generating the tracks 32 can be greatly simplified if, instead of using a direct magnetostatic analog, another electrostatic analog is employed first. In fact, each track 32 can be obtained by first using the same electrostatic analog as was used to generate the spokes 28, except that different boundary conditions must be employed.

When generating the spokes 28, the boundary conditions were established such that the rate of change of the potential ($d\phi/dn$) normal to the edges of the uppermost layer 16 and each obstacle 30 is zero. To generate the tracks 32 so each is generally perpendicular to a spoke 28, the boundary conditions are established such that at the boundary of the layer 16 and at the obstacles 30, the potential $\phi_2$ (as distinguished from $\phi$, the potential established for the previous conditions) is a constant. From these conditions, the potential $\phi_2$ everywhere else on the layer 16 can be computed by numerical analysis as taught in the Hechtman et al. application. Once the potential $\phi_2$ is computed by numerical analysis, the x and y components, $B_x$ and $B_y$, of the magnetic field B which lies in the simulated electric field may be obtained by the Cauchy-Riemann conditions:

$B_x = d\phi/dx$ $B_y = d\phi/dy$

The x and y components of the magnetic field B can be obtained by numeric differential techniques. Once the magnetic field is established, the lines of magnetostatic equipotential can be determined, and the tracks 32 can be plotted to coincide therewith. As may be appreciated from FIG. 4, when the tracks 32 are superimposed on the spokes 28, a grid is established linking the test points 18 to the probe points 20.

Once the tracks 32 have been superimposed on the spokes 28 to create the grid shown in FIG. 4, the next step (step 34) is to actually route the paths 22 between selected pairs of the test points 18 and probe points 20 along the spokes and the tracks 32. One way to obtain the paths 22 is to route them manually using the grid of spokes 28 and tracks 32 as an aid. An operator would start each path 22 at a selected one of the test points 18 and then follow one of the spokes 28 radiating from the test point to the closest track 32. The operator would continue the path 22 along the track 32 to the next spoke 28 and then follow the spoke to another track. By continuing along various ones of the spokes 28 and tracks 32, the resultant path 22 will link a particular pair of test points 18 and probe points 20.

Automation of the process of routing the paths 22 along the spokes 28 and 32 can be accomplished, with the aid of a digital computer (not shown), using a network flow analog. The grid formed of the spokes 28 and the tracks 32 can be regarded as a network within which the test points 18 and the probe points 20 can be regarded as sinks and sources, respectively. The edges or vertices of the network are the spokes 28 and tracks 32 which have a unitary capacity. The resultant "flow" in the network of spokes 28 and tracks 32 between the test points 18 and probe points 20 is along a path 22, comprised of a particular set of tracks and spokes. The maximal flow in the network of tracks 28 and spokes 32 is established when the maximum number of test points 18 and probe points 20 are routed to each other.

By establishing the "flow" between test points 18 and probe points 20 within the network of spokes 28 and tracks 32, the paths 22 can thus be defined. Techniques for solving network flow problems of this type are well known, and can easily be adapted to the present problem to establish the locations of the paths 22 within the network of spokes 28 and tracks 32. For a further discussion of network flow analysis, reference should be had to chapter 10 of the text *Introduction to Combinatorial Mathematics*, by C. L. Liu (McGraw Hill, 1968), herein incorporated by reference.

As described, the instant routing technique may be employed to route a set of paths 22 on the exposed surface of the uppermost layer 16 between the test points 18 and probe points 20 of FIG. 1. The present technique can also be used to route a set of paths 22 on each of the underlying layers 16 between a pair of vias 24 by superimposing a grid of spokes 28 and tracks 32 on each layer or by superimposing the spokes on one layer and the tracks on another. With such a "multilayer" approach, great flexibility can be afforded in routing the paths 22.

Once the paths 22 are routed, that is, the location of the paths on each of the layer(s) 16 is determined, it becomes a relatively minor matter to actually establish the paths on the fixture 10. In practice, once the paths 22 are routed, an art master (not shown), which similar to a photographic negative, is obtained by plotting the paths on a sheet of clear film. The resultant art master is then used to photolithographically establish the requisite pattern of metallization on each layer 16 of the fixture 10 to obtain the conductive paths 22 linking selected pairs of test points 18 and probe points 20.

In the above-described embodiment, the spokes 28 and tracks 32 are obtained by the use of electrostatic analogs. However, it is possible to simulate the tracks 28 and the spokes 32 in other ways. For example, the spokes 28 and tracks 32 could be generated using polar coordinates. Typically, the tracks 32 would be generated first, with each track taking the form of a separate one of a set of circles concentric about the centroid of the test points 18. The spokes 28 would be generated such that each of the test points 18 is connected to the innermost track 32, and each of the probe points is connected to the outermost track. Others of the spokes would be radially arranged to connect the tracks 32 to each other. The disadvantage to generating the spokes 28 and tracks 32 in this fashion is that the obstacles 30 cannot be easily accounted for, making it difficult to obtain a set of paths which avoid the obstacles.

The foregoing describes a technique for routing a set of paths 22 between selected test points 18 and probe points 20 on a fixture 10.

It is to be understood that the above-described embodiments are merely illustrative of the principles of the invention. Various modifications and changes may be made thereto by those skilled in the art which will embody the principles of the invention and fall within the spirit and scope thereof.

I claim:

1. A method for routing paths on an object between selected pairs of first and second points, comprising the steps of:

simulating a set of spokes linking each of the first set of points to at least an arbitrary one of the second set of points;

superimposing a simulated set of generally concentric tracks on the spokes such that each track is substantially everywhere perpendicular to each of the spokes, the tracks simulated by: (a) simulating an electric field between the first and second set of points by attributing an equal but opposite point charge to the first and second sets of points, respectively, such that the total sum of the charges is zero, (b) locating the lines of magnetostatic equipotential within the electric field, and (c) establishing each track to coincide with a separate one of the magnetostatic equipotential lines and;

establishing a path between each selected first and second point along at least a portion of at least one of the spokes and tracks.

2. The method according to claim 1 wherein the spokes are simulated using an electrostatic analog.

3. The method according to claim 2 wherein the spokes are simulated by the steps of:

simulating an electric field between the first and second set of points by attributing equal but opposite point charges thereto such that the total sum of the charges is zero;

locating the lines of electric flux in the field; and establishing each spoke so that it coincides with one of the lines of electric flux.

4. The method according to claim 1 wherein the path between each selected pair of first and second points is located along at least a portion of the spokes and tracks using network flow techniques.

5. A method for routing paths on a major surface of a substrate between selected pairs of first and second points, comprising the steps of:

simulating a set of spokes on the substrate major surface linking each of the first set of points to at least an arbitrary one of the second set of points;

superimposing, on the substrate major surface, a simulated set of generally concentric tracks on the spokes such that each track is substantially everywhere perpendicular to each of the spokes, the tracks simulated by: (a) simulating an electric field between the first and second set of points by attributing an equal but opposite point charge to the first and second set of points, respectively so that the total sum of the charges is zero, (b) locating the lines of magnetostatic potential within the electric field, and (c) establishing each track to coincide with a separate one of the magnetostatic equipotential lines; and establishing a path on the substrate surface between each first and selected second point along at least a portion of at least one of the spokes and tracks.

6. The method according to claim 5 wherein the spokes are simulated using an electrostatic analog.

7. The method according to claim 6 wherein the spokes are simulated by the steps of:

simulating an electric field between the first and second set of points by attributing equal but opposite point charges thereto such that the total sum of the charges is zero;

locating the lines of electric flux in the field; and establishing each spoke so that it coincides with one of the lines of electric flux.

8. The method according to claim 5 wherein the tracks are simulated by the steps of:

simulating an electric field between the first and second set of points by attributing equal but opposite point charges thereto such that the total sum of the charges is zero;

locating the lines of magentostatic equipotential within the electric field; and establishing each track so as to coincide with a separate one of the magnetostatic equipotential lines.

9. The method according to claim 5 wherein the path between each selected pair of first and second points is located along at least a portion of the spokes and tracks using network flow techniques.

* * * * *